(12) United States Patent
Choi et al.

(10) Patent No.: US 10,338,438 B2
(45) Date of Patent: Jul. 2, 2019

(54) ARRAY SUBSTRATE HAVING PARTIALLY OXIDIZED SOURCE ELECTRODE, DRAIN ELECTRODE AND DATA LINE

(71) Applicant: BOE TECHNOLOGY GROUP CO., LTD., Beijing (CN)

(72) Inventors: Seungjin Choi, Beijing (CN); Heecheol Kim, Beijing (CN); Youngsuk Song, Beijing (CN); Seongyeol Yoo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/436,066

(22) PCT Filed: Jul. 11, 2014

(86) PCT No.: PCT/CN2014/082023
§ 371 (c)(1),
(2) Date: Apr. 15, 2015

(87) PCT Pub. No.: WO2015/143796
PCT Pub. Date: Oct. 1, 2015

(65) Prior Publication Data
US 2017/0003553 A1 Jan. 5, 2017

(30) Foreign Application Priority Data
Mar. 28, 2014 (CN) .......................... 2014 1 0130729

(51) Int. Cl.
*H01L 21/77* (2017.01)
*H01L 21/02* (2006.01)
(Continued)

(52) U.S. Cl.
CPC .... *G02F 1/134309* (2013.01); *G02F 1/13439* (2013.01); *G02F 1/133345* (2013.01);
(Continued)

(58) Field of Classification Search
CPC ... H01L 27/3248; H01L 27/3276–3279; H01L 27/124; H01L 21/02244;
(Continued)

(56) References Cited

U.S. PATENT DOCUMENTS

2006/0102907 A1* 5/2006 Lee ..................... H01L 27/1214
257/72
2008/0227243 A1* 9/2008 Yang ................... H01L 27/1288
438/159

(Continued)

FOREIGN PATENT DOCUMENTS

CN 1710721 A 12/2005
CN 101132011 A 2/2008
(Continued)

OTHER PUBLICATIONS

Chinese Office Action with English Language Translation, dated Jan. 13, 2016, Chinese Application No. 201410130729.0.
(Continued)

*Primary Examiner* — Kevin Parendo
(74) *Attorney, Agent, or Firm* — Womble Bond Dickinson (US) LLP

(57) ABSTRACT

The embodiments of the invention disclose an array substrate, a manufacturing method thereof and a display device. Due to the fact that the surfaces of a source electrode, a drain electrode and a data line which are arranged on the same layer are provided with an oxide film which is formed after annealing treatment is conducted on the source electrode, the drain electrode and the data line, in the process that the pattern of a pixel electrode is formed on the source electrode, the drain electrode and the data line by the adoption of a composition technology, the oxide film can protect the source electrode and the data line under the oxide film from being corroded by an etching agent when the pattern of the
(Continued)

pixel electrode is formed by etching, and the display quality of a display panel will not be affected.

8 Claims, 10 Drawing Sheets

(51) Int. Cl.
H01L 27/12 (2006.01)
G02F 1/1333 (2006.01)
G02F 1/1343 (2006.01)
G02F 1/1362 (2006.01)

(52) U.S. Cl.
CPC .. G02F 1/136286 (2013.01); H01L 21/02244 (2013.01); H01L 21/02255 (2013.01); H01L 27/124 (2013.01); H01L 27/1259 (2013.01); G02F 1/134363 (2013.01); G02F 1/136227 (2013.01); G02F 2001/134318 (2013.01); G02F 2001/134372 (2013.01); G02F 2001/136295 (2013.01); G02F 2201/121 (2013.01); G02F 2201/123 (2013.01)

(58) Field of Classification Search
CPC ......... H01L 21/02252; H01L 21/02255; H01L 27/1214–1296; H01L 27/3244–3276; H01L 29/66742–6678; H01L 29/786–78696; G01F 1/134309; G01F 1/136286; G01F 2001/13629; G01F 2001/136295; G01F 2201/121; G01F 1/136227

See application file for complete search history.

(56) References Cited

U.S. PATENT DOCUMENTS

| | | | |
|---|---|---|---|
| 2009/0101903 A1* | 4/2009 | Chen | H01L 27/124 257/59 |
| 2010/0099205 A1 | 4/2010 | Kim | |
| 2010/0155733 A1* | 6/2010 | Moon | G02F 1/136227 257/59 |
| 2011/0227085 A1* | 9/2011 | Nakamura | G02F 1/133502 257/59 |
| 2013/0063675 A1 | 3/2013 | Misaki | |
| 2013/0140556 A1* | 6/2013 | Park | H01L 29/78693 257/43 |
| 2013/0207103 A1 | 8/2013 | Lee | |
| 2014/0078438 A1 | 3/2014 | Suzuki | |
| 2014/0085577 A1 | 3/2014 | Zhou | |
| 2015/0153600 A1* | 6/2015 | Won | H01L 27/127 349/43 |

FOREIGN PATENT DOCUMENTS

| | | |
|---|---|---|
| CN | 102227761 A | 10/2011 |
| CN | 102799038 A | 11/2012 |
| CN | 103337522 A | 10/2013 |
| CN | 103915452 A | 7/2014 |
| CN | 203760478 U | 8/2014 |

OTHER PUBLICATIONS

International Search Report (PCT/CN2014/082023) dated Dec. 31, 2014, 13 pages.
"Extended European Search Report," EP Application No. 14861185.8 (dated Dec. 21, 2017).

* cited by examiner ns ARRAY SUBSTRATE HAVING PARTIALLY OXIDIZED SOURCE ELECTRODE, DRAIN ELECTRODE AND DATA LINE

FIELD OF THE INVENTION

The present invention relates to the field of display, in particular to an array substrate, a manufacturing method thereof and a display device.

BACKGROUND OF THE INVENTION

Liquid crystal display is mainly composed of an opposite substrate, an array substrate, and a liquid crystal layer located between the two substrates. Generally, patterns such as gate lines, data lines, thin film transistors (TFT) and pixel electrodes are arranged on one side of the array substrate. A TFT specifically comprises: a gate electrode and an active layer mutually insulated; a source electrode and a drain electrode electrically connected to the active layer respectively; wherein the gate electrode is electrically connected to the gate line, the source electrode is electrically connected to the data line, the drain electrode is electrically connected to the pixel electrode. Patterns such as black matrix and color films are arranged on one side of a color film substrate.

At present, in the existing manufacturing process of the array substrate, usually a one-time composition process is adopted to form the patterns of a gate electrode 102 and a gate line 103 on an underlay substrate 101, as shown in FIG. 1a; then a gate insulating layer is formed on the underlay substrate 101; a pattern of an active layer 104 is formed on a region of the gate insulating layer corresponding to the pattern of the gate electrode 102, as shown in FIG. 1b; then a pattern of a etching barrier layer 105 is formed, as shown in FIG. 1c; a one-time composition process is adopted to form the patterns of a source electrode 106, a drain electrode 107 and a data line 108, as shown in FIG. 1d; finally, a pattern of a pixel electrode 109 electrically connected with the drain electrode 107 is formed, as shown in FIG. 1e. After the pattern of the pixel electrode 109 is formed, patterns of an insulating layer and common electrodes 110 are typically formed, as shown in FIG. 1f.

After the patterns of the source electrode, drain electrode and data line are formed, a pattern of the pixel electrode is typically formed with a photolithography process, i.e., an indium tin oxides (ITO) film and a photoresist film are formed in sequence by stacking on the patterns of the source electrode, drain electrode and data line; then the photoresist film is treated with exposure and development processes; an etching process is performed with etching agent for the ITO film on which the photoresist does not cover, wherein the region treated by the etching process comprises the ITO film covering over the source electrode and the data line; finally, the remaining photoresist is peeled off to obtain the pattern of the pixel electrode.

In the specific implementation, metals such as copper are commonly used for the patterns of the source electrode, the drain electrode and the data line; in such a manner, during the etching process for the ITO film covering over the patterns of the source electrode and the data line, etching agent will be in direct contact with the source electrode and the data line, resulting in corrosion of the source electrode and the data line; moreover, the high temperature environment during the subsequent forming of insulating layer will accelerate the corrosion process, which will affect the display quality of the liquid crystal display.

Therefore, how to avoid the source electrode and the data line being corroded by the etching agent is a technical problem to be solved by those skilled in the art.

SUMMARY OF THE INVENTION

In view of this, embodiments of the invention provide an array substrate, a manufacturing method thereof and a display device, to solve the problem of the source electrode and the data line being corroded by the etching agent in the prior art.

Therefore, an embodiment of the present invention provides an array substrate, the array substrate comprises: an underlay substrate; a source electrode, a drain electrode and a data line, which are arranged in the same layer on the underlay substrate; and a pixel electrode arranged on the layer, in which the source electrode, the drain electrode and the data line are arranged; the array substrate further comprises: a connecting portion;

an oxide film which is formed on the surfaces of the source electrode, the drain electrode and the data line after annealing treatment is conducted on the source electrode, the drain electrode and the data line;

a first via hole arranged over the drain electrode and penetrating through the oxide film; the connecting portion electrically connects the drain electrode with the pixel electrode through the first via hole.

In the array substrate provided by the embodiment of the present invention, due to the fact that the surfaces of a source electrode, a drain electrode and a data line which are arranged on the same layer are provided with an oxide film which is formed after annealing treatment is conducted on the source electrode, the drain electrode and the data line, in the process that a pattern of a pixel electrode is formed on the source electrode, the drain electrode and the data line by the adoption of a composition technology, the oxide film can protect the source electrode and the data line under the oxide film from being corroded by an etching agent when the pattern of the pixel electrode is formed by etching, and the display quality of a display panel will not be affected; meanwhile, a connecting portion enables the drain electrode to be electrically connected with the pixel electrode through a first via hole arranged over the drain electrode and penetrating through the oxide film, therefore the normal display function of the display panel can be ensured.

In particular, when the array substrate provided by the embodiment of the present invention is applied in an advanced super dimensional field switch type liquid crystal display, the array substrate can further comprise: a passivation layer and a common electrode arranged sequentially over the pixel electrode; the passivation layer extends over the drain electrode;

the connecting portion and the common electrode are arranged in the same layer and are mutually insulated, and the first via hole also penetrates through the passivation layer;

patterns of the pixel electrode, the source electrode, the drain electrode and the data line do not overlap mutually;

a second via hole arranged over the pixel electrode and penetrating through the passivation layer, the connecting portion is electrically connected with the pixel electrode through the second via hole.

Or, in particular, when the array substrate provided by the embodiment of the present invention is applied in an advanced super dimensional field switch type liquid crystal display, the array substrate can further comprise: a common electrode arranged between the pixel electrode and the layer in which the source electrode, the drain electrode and the data line are arranged; and a passivation layer arranged between the pixel electrode and the common electrode, the passivation layer extends over the drain electrode;

patterns of the common electrode and the drain electrode do not overlap mutually;

the connecting portion and the pixel electrode are arranged in the same layer, and the first via hole also penetrates through the passivation layer.

Preferably, to decrease the resistance of the source electrode, the drain electrode and the data line, in the array substrate provided by the embodiment of the present invention, the material of the source electrode, the drain electrode and the data line is copper, the material of the oxide film is copper oxide.

The array substrate provided by the embodiment of the present invention can further comprise:

an active layer electrically connected with the source electrode and the drain electrode and arranged below the source electrode and the drain electrode;

a gate electrode insulated with the active layer and arranged opposite the active layer.

Preferably, in the array substrate provided by the embodiment of the present invention, the thickness of the oxide film is 10 nm to 100 nm. In this way, the formed oxide film can protect the source electrode and the data line from being corroded by the etching agent; the normal transmission of the carrier between the source electrode and the drain electrode can also be ensured.

An embodiment of the present invention further provides a manufacturing method of an array substrate; the method comprises:

forming patterns of a source electrode, a drain electrode and a data line on an underlay substrate with a one-time composition process;

performing an annealing process to the underlay substrate, on which the patterns of the source electrode, the drain electrode and the data line are formed; forming an oxide film on the patterns of the source electrode, the drain electrode and the data line;

forming patterns of a pixel electrode and a connecting portion on the underlay substrate after the annealing process; wherein the connecting portion electrically connects the drain electrode with the pixel electrode through a first via hole, which is arranged over the drain electrode and penetrates through the oxide film.

In the manufacturing method of an array substrate provided by the embodiment of the present invention, after forming patterns of a source electrode, a drain electrode and a data line on an underlay substrate with a one-time composition process, an annealing process is performed on the underlay substrate to form an oxide film on the patterns of the source electrode, the drain electrode and the data line, then the patterns of a pixel electrode and a connecting portion are formed; in this way, the oxide film can protect the source electrode and the data line under the oxide film from being corroded by an etching agent when the pattern of the pixel electrode is formed by etching, and the display quality of a display panel will not be affected; meanwhile, a connecting portion enables the drain electrode to be electrically connected with the pixel electrode through a first via hole arranged over the drain electrode and penetrating through the oxide film, therefore the normal display function of the display panel can be ensured.

In particular, in the manufacturing method provided by the embodiment of the invention, the step of forming a pattern of a pixel electrode on the underlay substrate comprises:

forming a pattern of a pixel electrode on the underlay substrate, the pattern of the pixel electrode does not mutually overlap with the patterns of the source electrode, the drain electrode and the data line;

when the array substrate manufactured with the manufacturing method provided by the embodiment of the present invention is applied in an advanced super dimensional field switch type liquid crystal display, the method further comprises:

forming a passivation layer film on the underlay substrate, on which underlay substrate the pattern of the pixel electrode is formed; forming a first via hole in the oxide film and the passivation layer film over the drain electrode with an etching process; forming a second via hole in the passivation layer film over the pixel electrode when the first via hole is formed;

forming mutually insulated patterns of a common electrode and a connecting portion on the pattern of the passivation layer; the connecting portion is electrically connected with the drain electrode through the first via hole, and is electrically connected with the pixel electrode through the second via hole.

Or, in particular, when the array substrate manufactured with the manufacturing method provided by the embodiment of the present invention is applied in an advanced super dimensional field switch type liquid crystal display, before the step of forming patterns of a pixel electrode and a connecting portion on the underlay substrate, the method further comprises:

forming a pattern of a common electrode on the underlay substrate, the pattern of the common electrode does not mutually overlap with the pattern of the drain electrode;

forming a passivation layer film on the underlay substrate, on which underlay substrate the pattern of the common electrode is formed; forming a first via hole in the oxide film and the passivation layer film over the drain electrode with an etching process.

In particular, the step of forming patterns of a pixel electrode and a connecting portion on the underlay substrate after the annealing process comprises:

forming electrically connected patterns of a pixel electrode and a connecting portion on the pattern of the passivation layer; the connecting portion is electrically connected with the drain electrode through the first via hole.

Preferably, to ensure a moderate thickness of the formed oxide film, in the manufacturing method provided by the embodiment of the invention, the step of performing an annealing process to the underlay substrate comprises:

performing a heating process to the underlay substrate in oxygen condition, the heating temperature is 150° C. to 200° C., the heating time is 10 min to 1 h.

Further, in the manufacturing method provided by the embodiment of the invention, before the step of forming patterns of a source electrode, a drain electrode and a data line on an underlay substrate, the method further comprises:

forming patterns of a gate electrode and a gate line on the underlay substrate with a one-time composition process;

forming a gate insulating layer on the underlay substrate with the patterns of the gate electrode and the gate line;

forming a pattern of an active layer on the gate insulating layer corresponding to the region of the gate electrode;

forming a pattern of an etching barrier layer on the underlay substrate with the pattern of the active layer.

An embodiment of the present invention further provides a display device comprising the array substrate according to the embodiments of the present invention.

DETAILED DESCRIPTION OF THE INVENTION

Figure 1A:
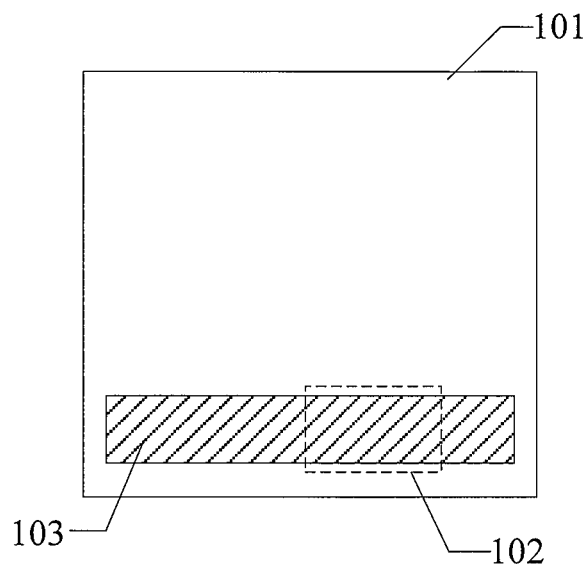
FIG. 1a-FIG. 1f are respectively structural schematic diagrams of the steps in a manufacturing method of an array substrate in the prior art.
Figure 1B:
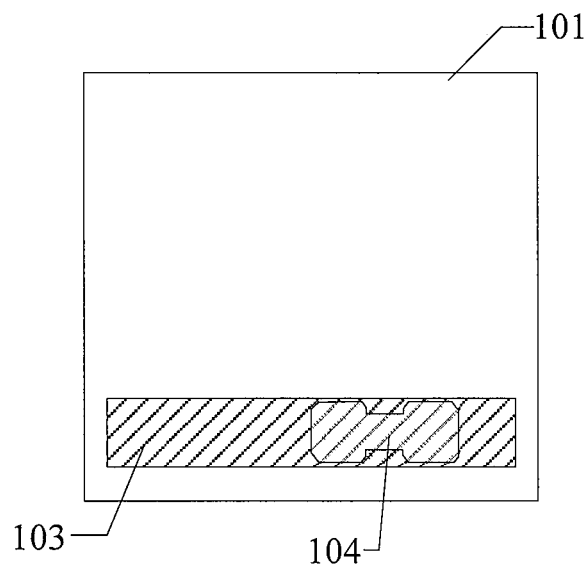
Figure 1C:
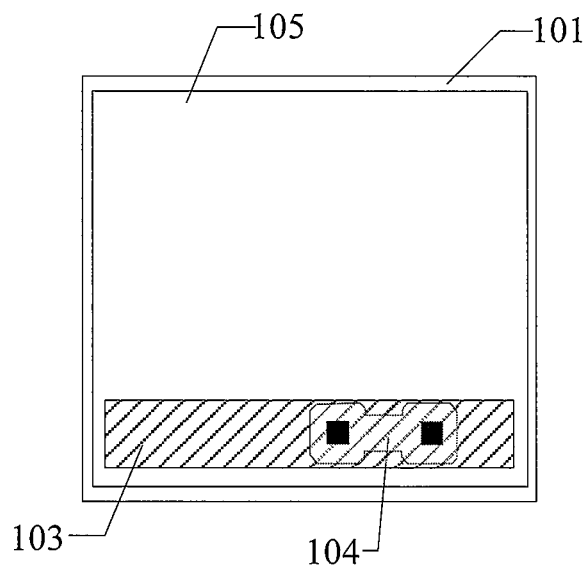
Figure 1D:
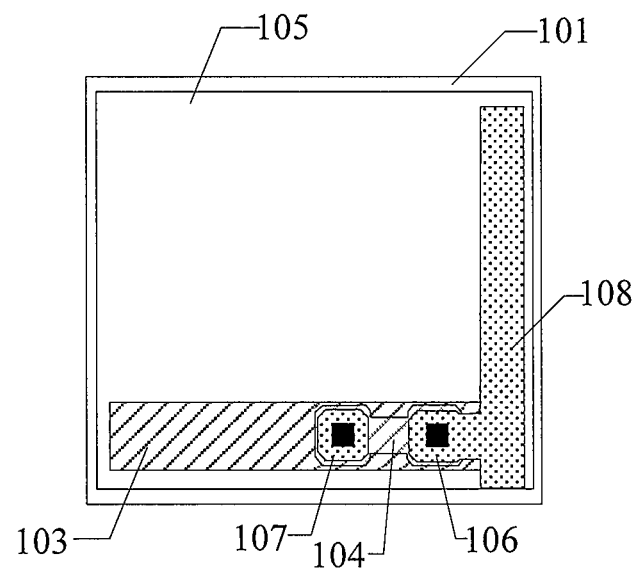
Figure 1E:
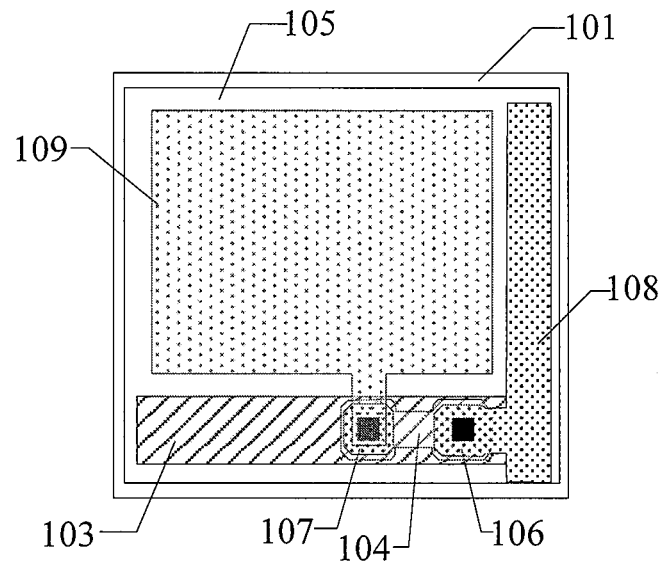
Figure 1F:
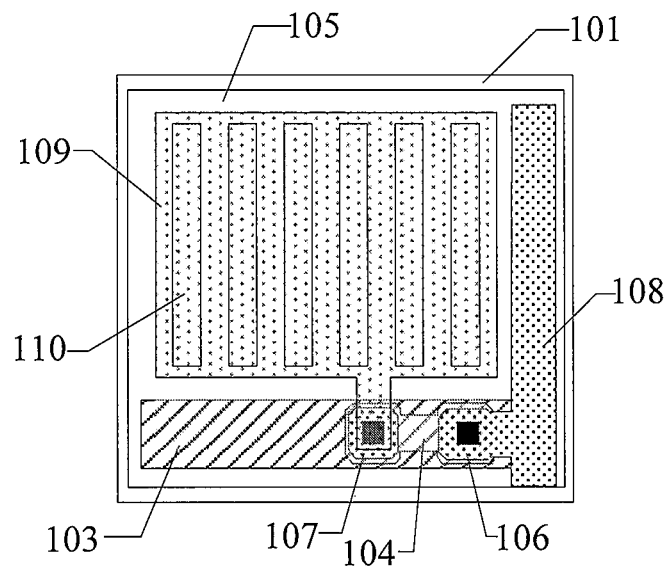

The present invention will be described below in more detail in combination with the drawings and the embodiments. The following embodiments are used for explanation of the present invention, not for limitation of the scope of the present invention.

In the drawings, the shape and thickness of each layer do not reflect the real scale of the array substrate, but illustrate the present invention.

Figure 2:
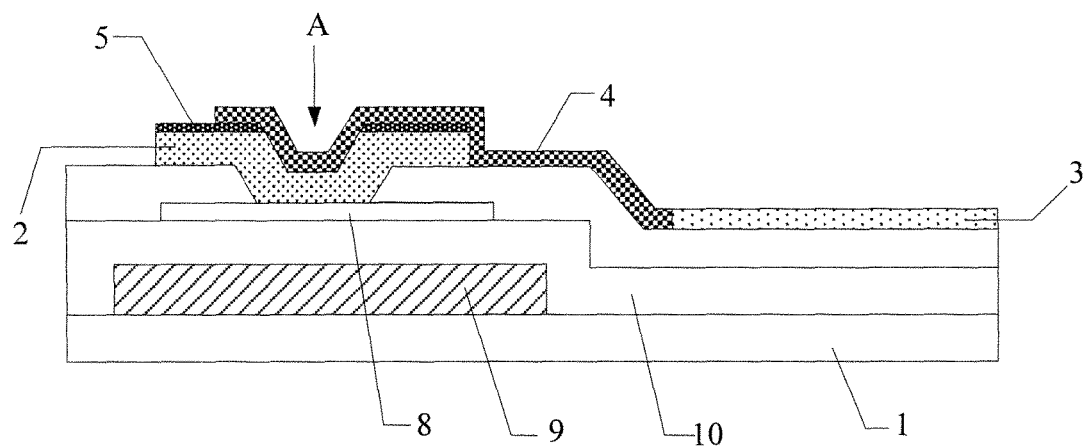
FIG. 2 is a structural schematic diagram of the array substrate provided by an embodiment of the present invention, which array substrate is applied in a TN type liquid crystal display.

As shown in FIG. 2, an embodiment of the present invention provides an array substrate, the array substrate comprises: an underlay substrate 1; a source electrode, a drain electrode 2 and a data line, which are arranged in the same layer on the underlay substrate 1; and a pixel electrode 3 arranged on the layer, in which the source electrode, the drain electrode 2 and the data line are arranged; the array substrate further comprises: a connecting portion 4;

an oxide film 5 which is formed on the surfaces of the source electrode, the drain electrode 2 and the data line after annealing treatment is conducted on the source electrode, the drain electrode 2 and the data line;

a first via hole A arranged over the drain electrode 2 and penetrating through the oxide film 5; the connecting portion 4 electrically connects the drain electrode 2 with the pixel electrode 3 through the first via hole A.

In the array substrate provided by the embodiment of the present invention, due to the fact that the surfaces of a source electrode, a drain electrode 2 and a data line which are arranged on the same layer are provided with an oxide film 5 which is formed after annealing treatment is conducted on the source electrode, the drain electrode 2 and the data line, in the process that the pattern of the pixel electrode 3 is formed on the source electrode, the drain electrode 2 and the data line by the adoption of a composition technology, the oxide film 5 can protect the source electrode and the data line under the oxide film 5 from being corroded by an etching agent when the pattern of the pixel electrode 3 is formed by etching, and the display quality of a display panel will not be affected; meanwhile, a connecting portion 4 enables the drain electrode 2 to be electrically connected with the pixel electrode 3 through a first via hole A arranged over the drain electrode 2 and penetrating through the oxide film 5, therefore the normal display function of the display panel can be ensured.

In particular, since the oxide film 5 is formed on the surfaces of the source electrode, the drain electrode 2 and the data line after annealing treatment is conducted on the source electrode, the drain electrode 2 and the data line, it is unnecessary to produce the oxide film 5 with a single composition process; compared with the prior art, during the actual manufacturing process of the array substrate provided by the embodiment of the present invention, the number of masks will not be increased.

In the specific implementation, the step of performing an annealing process to the underlay substrate 1 with the formed source electrode, the drain electrode 2 and the data line generally comprises: performing a heating process to the underlay substrate 1 with the formed source electrode, the drain electrode 2 and the data line in oxygen condition; the heating temperature is controlled in the range of 150° C. to 200° C., and the heating time is controlled in the range of 10 min to 1 h.

Preferably, in the array substrate provided by the embodiment of the present invention, the thickness of the oxide film 5 is controlled in the range of 10 nm to 100 nm. In this way, the formed oxide film 5 can protect the source electrode and the data line from being corroded by the etching agent; the normal transmission of the carrier between the source electrode and the drain electrode 2 can also be ensured.

Preferably, to decrease the resistance of the source electrode, the drain electrode 2 and the data line, generally the patterns of the source electrode, the drain electrode 2 and the data line is formed with metallic copper; after the annealing process, the oxide film formed on the surfaces of the source electrode, the drain electrode 2 and the data line is a film of copper oxide.

Certainly, in an implementation, other metal can also be applied to form the source electrode, the drain electrode 2 and the data line, which is not limited herein.

In an implementation, the array substrate provided by the embodiment of the present invention can be applied in a TN (Twisted Nematic) type liquid crystal display, as shown in FIG. 2; or, the array substrate provided by the embodiment of the present invention can also be applied in an ADS (Advanced Super Dimension Switch) type liquid crystal display, which is not limited herein.

Figure 3A:
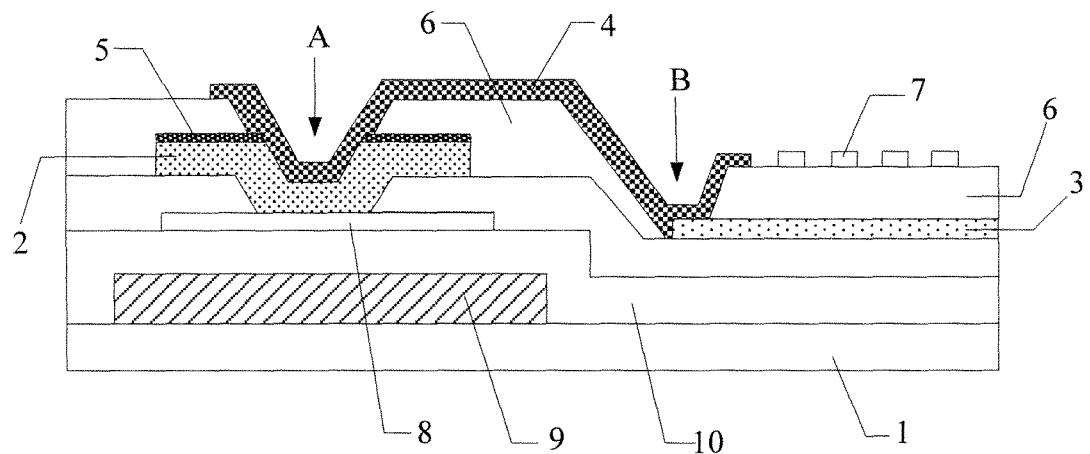
FIG. 3a and FIG. 3b are structural schematic diagrams of the array substrates provided by the embodiments of the present invention, which array substrates are applied in an ADS type liquid crystal display.

When the array substrate provided by the embodiment of the present invention is applied in an ADS type liquid crystal display, as shown in FIG. 3a, the array substrate can further comprise: a passivation layer 6 and a common electrode 7 arranged sequentially over the pixel electrode 3; the passivation layer 6 extends over the drain electrode 2; the connecting portion 4 and the common electrode 7 are arranged in the same layer and are mutually insulated, and the first via hole A also penetrates through the passivation layer 6 (i.e., the first via hole A penetrates through the oxide film 5 and the passivation layer 6); patterns of the pixel electrode 3, the source electrode, the drain electrode 2 and the data line do not overlap mutually; a second via hole B arranged over the pixel electrode 3 and penetrating through the passivation layer 6, the connecting portion 4 is electrically connected with the pixel electrode 3 through the second via hole B. Moreover, the connecting portion 4 is electrically connected with the drain electrode 2 through the first via hole A, which is arranged over the drain electrode 2 and penetrating through the oxide film 5 and the passivation layer 6; in this way, the drain electrode 2 is electrically connected with the pixel electrode 3 by means of the connecting portion 4.

Figure 3B:
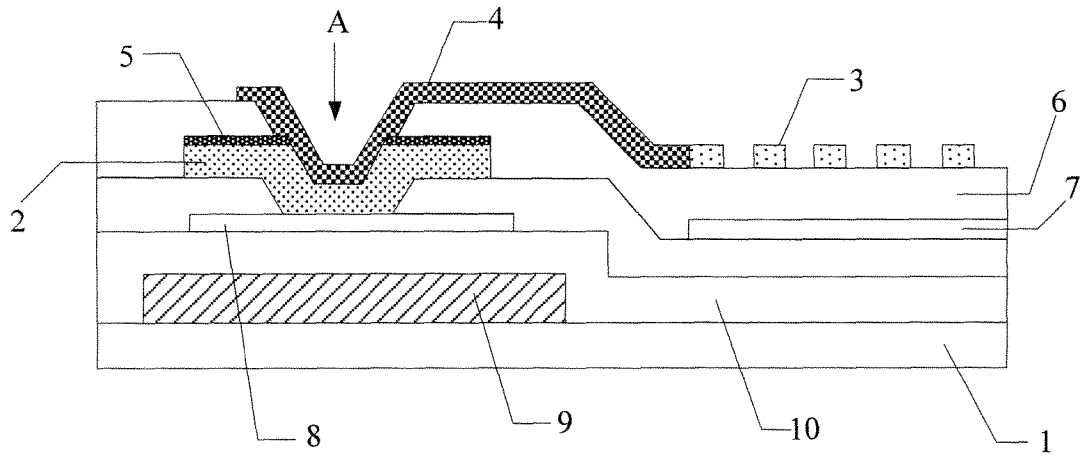

Or, when the array substrate provided by the embodiment of the present invention is applied in an ADS type liquid crystal display, as shown in FIG. 3b, the array substrate can further comprise: a common electrode 7 arranged between the pixel electrode 3 and the layer in which the source electrode, the drain electrode 2 and the data line are arranged; and a passivation layer 6 arranged between the pixel electrode 3 and the common electrode 7, the passivation layer 6 extends over the drain electrode 2; patterns of the common electrode 7 and the drain electrode 2 do not overlap mutually; the connecting portion 4 and the pixel electrode 3 are arranged in the same layer, and the first via hole A also penetrates through the passivation layer 6 (i.e., the first via hole A penetrates through the oxide film 5 and the passivation layer 6). The connecting portion 4 is electrically connected with the drain electrode 2 through the first via hole A, which is arranged over the drain electrode 2 and penetrating through the oxide film 5 and the passivation layer 6; in this way, the drain electrode 2 is electrically connected with the pixel electrode 3 by means of the connecting portion 4.

In an implementation of the array substrate provided by the embodiment of the invention, the thin film transistor in the array substrate can have a bottom gate structure, as shown in FIG. 2, FIG. 3a and FIG. 3b. The array substrate can further comprise: an active layer 8 electrically connected with the source electrode and the drain electrode 2 and arranged below the source electrode and the drain electrode 2; and a gate electrode 9 insulated with the active layer 8 and arranged opposite the active layer 8.

Certainly, the thin film transistor in the array substrate can have a top gate structure, i.e., the array substrate can then further comprise: an active layer 8 electrically connected with the source electrode and the drain electrode 2 and arranged over the source electrode and the drain electrode 2; and a gate electrode 9 insulated with the active layer 8 and arranged opposite the active layer 8, which is not limited herein.

Figure 4:
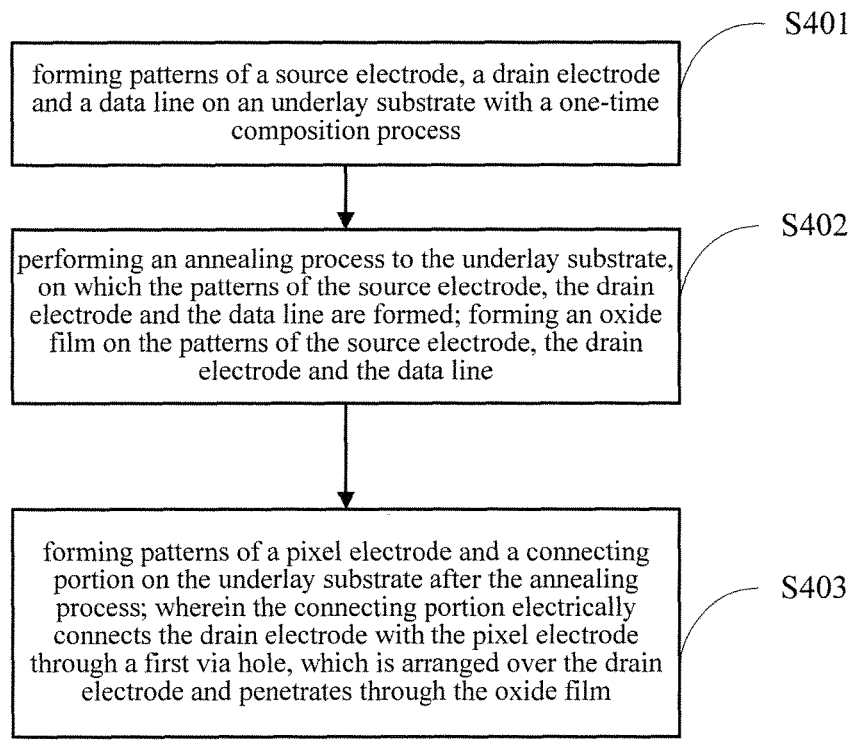
FIG. 4 is a flow diagram of the manufacturing method of an array substrate provided by the embodiment of the present invention.

Based on the same inventive concept, an embodiment of the present invention further provides a manufacturing method of an array substrate; as shown in FIG. 4, the method specifically comprises:

S401, forming patterns of a source electrode, a drain electrode and a data line on an underlay substrate with a one-time composition process;

in particular, to decrease the resistance of the source electrode, the drain electrode and the data line, generally the patterns of the source electrode, the drain electrode and the data line is formed with metallic copper by means of a one-time composition process. Certainly, other metal can also be applied to form the patterns of the source electrode, the drain electrode and the data line, which is not limited herein;

S402, performing an annealing process to the underlay substrate, on which the patterns of the source electrode, the drain electrode and the data line are formed; forming an oxide film on the patterns of the source electrode, the drain electrode and the data line;

in particular, since the oxide film is formed on the surfaces of the source electrode, the drain electrode and the data line after annealing treatment is conducted on the source electrode, the drain electrode and the data line, it is unnecessary to produce the oxide film with a single composition process; compared with the prior art, during the actual manufacturing process of the array substrate provided by the embodiment of the present invention, the number of masks will not be increased;

moreover, the oxide film is formed on the patterns of the source electrode, the drain electrode and the data line by performing an annealing process to the underlay substrate with the formed source electrode, the drain electrode and the data line in oxygen condition. For example, the source electrode, the drain electrode and the data line is made of metallic copper; after the annealing process, a film of copper oxide is formed on the surfaces of the source electrode, the drain electrode and the data line;

S403, forming patterns of a pixel electrode and a connecting portion on the underlay substrate after the annealing process; wherein the connecting portion electrically connects the drain electrode with the pixel electrode through a first via hole, which is arranged over the drain electrode and penetrates through the oxide film.

In the manufacturing method of an array substrate provided by the embodiment of the present invention, after forming patterns of a source electrode, a drain electrode and a data line on an underlay substrate with a one-time composition process, an annealing process is performed on the underlay substrate to form an oxide film on the patterns of the source electrode, the drain electrode and the data line, then the patterns of a pixel electrode and a connecting portion are formed; in this way, the oxide film can protect the source electrode and the data line under the oxide film from being corroded by an etching agent when the pattern of the pixel electrode is formed by etching, and the display quality of a display panel will not be affected; meanwhile, a connecting portion enables the drain electrode to be electrically connected with the pixel electrode through a first via hole arranged over the drain electrode and penetrating through the oxide film, therefore the normal display function of the display panel can be ensured.

In particular, in the manufacturing method provided by the embodiment of the invention, the step S403 of forming a pattern of a pixel electrode on the underlay substrate can comprise:

forming a pattern of a pixel electrode on the underlay substrate, the pattern of the pixel electrode does not mutually overlap with the patterns of the source electrode, the drain electrode and the data line;

furthermore, when the array substrate manufactured with the manufacturing method provided by the embodiment of the present invention is applied in an ADS type liquid crystal display, the method can further comprise:

firstly, forming a passivation layer film on the underlay substrate, on which underlay substrate the pattern of the pixel electrode is formed; forming a first via hole in the oxide film and the passivation layer film over the drain electrode with an etching process; forming a second via hole in the passivation layer film over the pixel electrode when the first via hole is formed;

secondly, forming mutually insulated patterns of a common electrode and a connecting portion on the pattern of the passivation layer; the connecting portion is electrically connected with the drain electrode through the first via hole, and is electrically connected with the pixel electrode through the second via hole.

Or, when the array substrate manufactured with the manufacturing method provided by the embodiment of the present invention is applied in an ADS type liquid crystal display, before the step S403 of forming patterns of a pixel electrode and a connecting portion on the underlay substrate, the method can further comprise:

firstly, forming a pattern of a common electrode on the underlay substrate, the pattern of the common electrode does not mutually overlap with the pattern of the drain electrode;

secondly, forming a passivation layer film on the underlay substrate, on which underlay substrate the pattern of the common electrode is formed; forming a first via hole in the oxide film and the passivation layer film over the drain electrode with an etching process.

In particular, the step S403 of forming patterns of a pixel electrode and a connecting portion on the underlay substrate after the annealing process can comprise: forming electrically connected patterns of a pixel electrode and a connecting portion on the pattern of the passivation layer; the connecting portion is electrically connected with the drain electrode through the first via hole.

Preferably, to ensure a moderate thickness of the formed oxide film, in the manufacturing method provided by the embodiment of the invention, the step S402 of performing an annealing process to the underlay substrate can comprise: performing a heating process to the underlay substrate in oxygen condition, the heating temperature is controlled in the range of 150° C. to 200° C., the heating time is controlled in the range of 10 min to 1 h.

In an implementation, taking manufacturing an array substrate having a thin film transistor with a bottom gate structure for example, in the manufacturing method provided by the embodiment of the invention, before the step S401 of forming patterns of a source electrode, a drain electrode and a data line on an underlay substrate, the method can further comprise:

firstly, forming patterns of a gate electrode and a gate line on the underlay substrate with a one-time composition process;

secondly, forming a gate insulating layer on the underlay substrate with the patterns of the gate electrode and the gate line;

then, forming a pattern of an active layer on the gate insulating layer corresponding to the region of the gate electrode;

finally, forming a pattern of an etching barrier layer on the underlay substrate with the pattern of the active layer.

The implementations of above mentioned two structures (i.e., the connecting portion and the common electrode being arranged in the same layer; or the connecting portion and the pixel electrode being arranged in the same layer) of the array substrates are respectively illustrated with two examples, in which the array substrates are applied in the ADS type liquid crystal display.

Figure 5A:
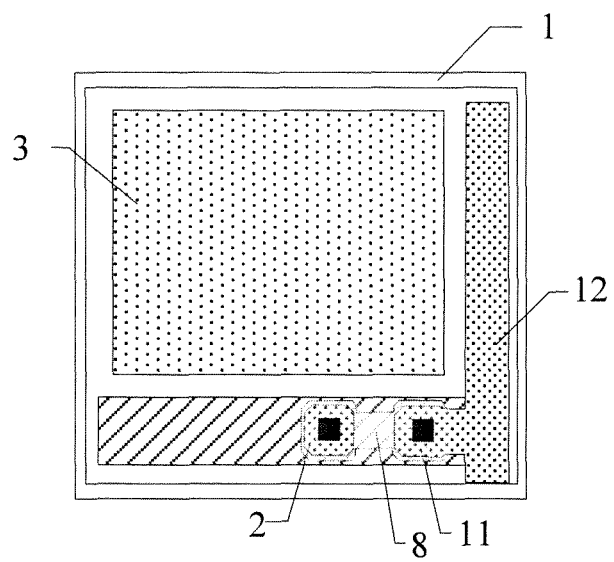
FIG. 5a-FIG. 5c are respectively top views showing the formed products of the steps in a manufacturing method of an array substrate provided by the first embodiment of the present invention.
Figure 5B:
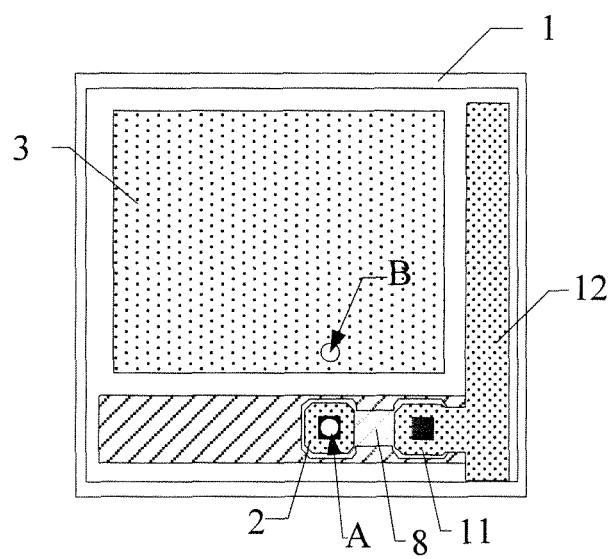
Figure 5C:
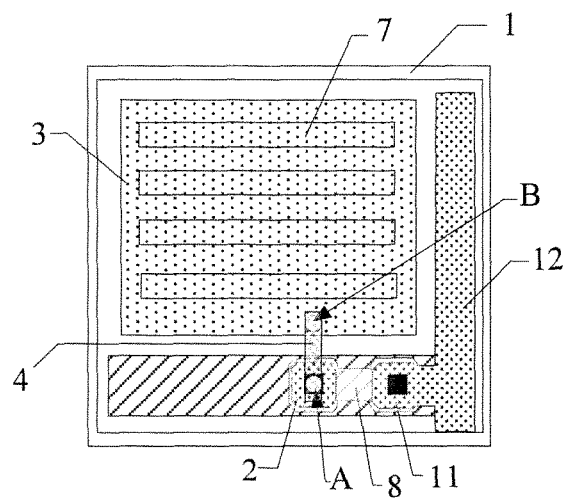
Figure 6A:
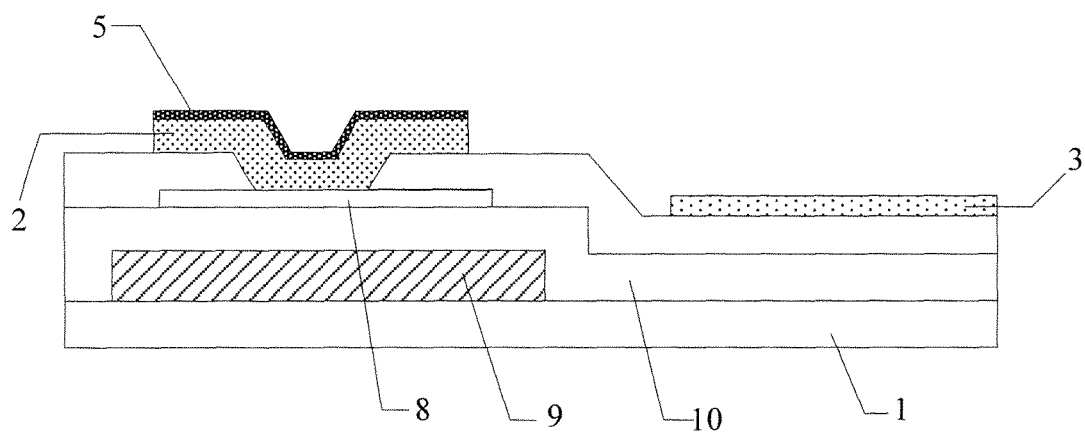
FIG. 6a and FIG. 6b are respectively side views showing the products corresponding to FIG. 5a and FIG. 5b.
Figure 6B:
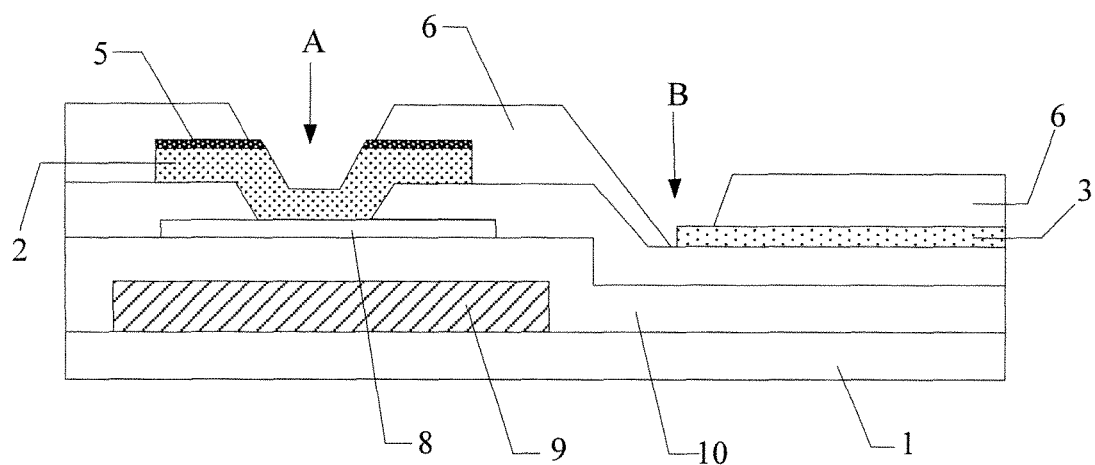

Example one: a manufacturing method of an array substrate in which the connecting portion and the common electrode is arranged in the same layer can specifically comprise:

1. forming patterns of a gate electrode, a gate line on an underlay substrate with a one-time composition process;

2. forming a gate insulating layer on the underlay substrate with the patterns of the gate electrode and the gate line;

3. forming a pattern of an active layer on the gate insulating layer corresponding to the region of the gate electrode;

4. forming a pattern of an etching barrier layer on the underlay substrate with the pattern of the active layer;

5. forming patterns of a source electrode, a drain electrode and a data line on an underlay substrate with a one-time composition process;

the above mentioned steps 1-5 are not improved by the manufacturing method of an array substrate provided by the embodiment of the present invention; the embodiments of the above mentioned steps 1-5 are same with the prior art, which will not be repeated herein;

6. performing an annealing process to the underlay substrate, on which the patterns of the source electrode, the drain electrode and the data line are formed; forming an oxide film on the patterns of the source electrode, the drain electrode and the data line;

7. forming a pattern of a pixel electrode 3 on the underlay substrate 1, the pattern of the pixel electrode 3 does not mutually overlap with the patterns of the source electrode (not shown in FIG. 6*a*), the drain electrode 2 and the data line 12 (not shown in FIG. 6*a*), as shown in FIG. 5*a* and FIG. 6*a*;

8. forming a passivation layer 6 (not shown in FIG. 5*b*) film on the underlay substrate 1, on which underlay substrate the pattern of the pixel electrode 3 is formed; forming a first via hole A in the oxide film 5 (not shown in FIG. 5*b*) and the passivation layer 6 film over the drain electrode 2 with an etching process; forming a second via hole B in the passivation layer 6 film over the pixel electrode 3 when the first via hole is formed, as shown in FIG. 5*b* and FIG. 6*b*;

9. forming mutually insulated patterns of a common electrode 7 and a connecting portion 4 on the pattern of the passivation layer 6 (not shown in FIG. 5*c*); the connecting portion 4 is electrically connected with the drain electrode 2 through the first via hole A, and is electrically connected with the pixel electrode 3 through the second via hole B, as shown in FIG. 5*c* and FIG. 3*a*.

Figure 7A:
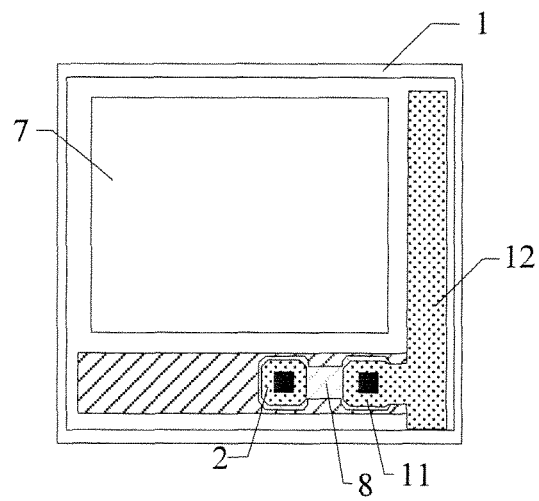
FIG. 7a-FIG. 7c are respectively top views showing the formed products of the steps in a manufacturing method of an array substrate provided by the second embodiment of the present invention.
Figure 7B:
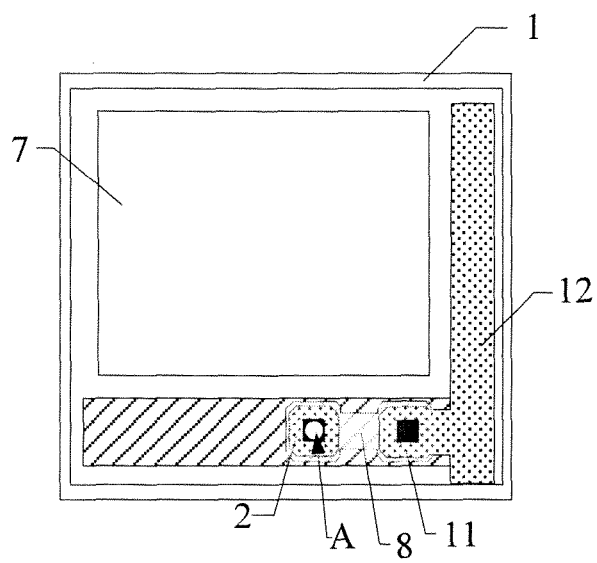
Figure 7C:
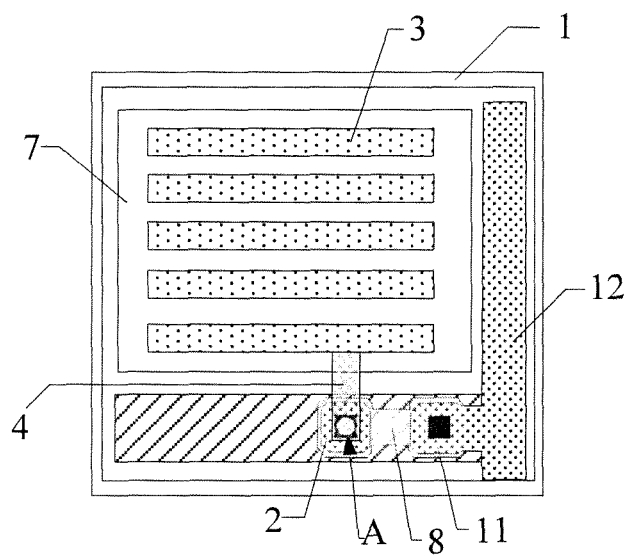
Figure 8A:
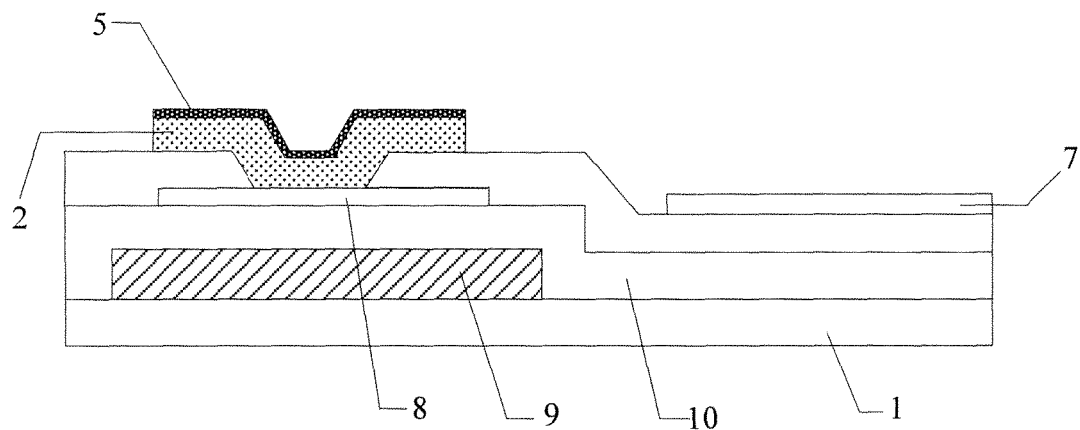
FIG. 8a and FIG. 8b are respectively side views showing the products corresponding to FIG. 7a and FIG. 7b.
Figure 8B:
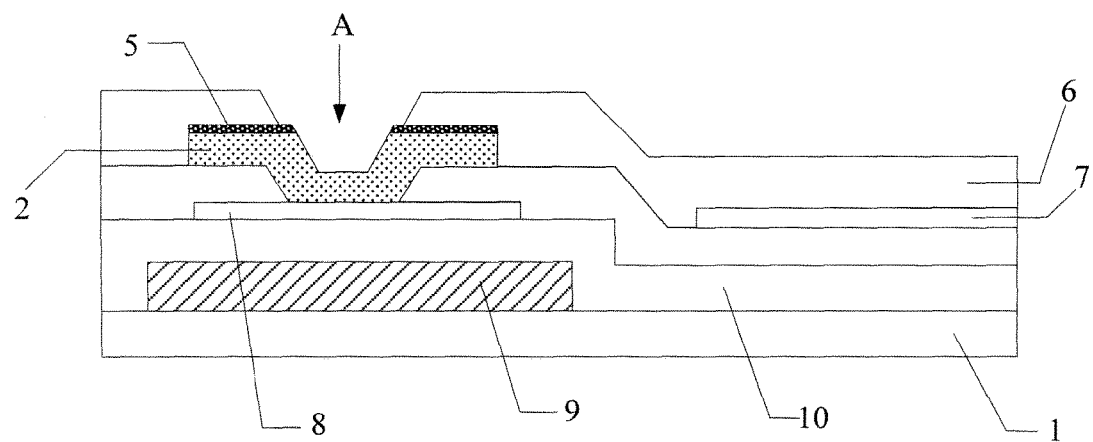

Example two: a manufacturing method of an array substrate in which the connecting portion and the pixel electrode is arranged in the same layer can specifically comprise:

1. forming patterns of a gate electrode, a gate line on an underlay substrate with a one-time composition process;

2. forming a gate insulating layer on the underlay substrate with the patterns of the gate electrode and the gate line;

3. forming a pattern of an active layer on the gate insulating layer corresponding to the region of the gate electrode;

4. forming a pattern of an etching barrier layer on the underlay substrate with the pattern of the active layer;

5. forming patterns of a source electrode, a drain electrode and a data line on an underlay substrate with a one-time composition process;

the above mentioned steps 1-5 are not improved by the manufacturing method of an array substrate provided by the embodiment of the present invention; the embodiments of the above mentioned steps 1-5 are same with the prior art, which will not be repeated herein;

6. performing an annealing process to the underlay substrate, on which the patterns of the source electrode, the drain electrode and the data line are formed; forming an oxide film on the patterns of the source electrode, the drain electrode and the data line;

7. forming a pattern of a common electrode 7 on the underlay substrate 1, the pattern of the common electrode 7 does not mutually overlap with the patterns of the source electrode 11 (not shown in FIG. 8a), the drain electrode 2 and the data line 12 (not shown in FIG. 8a), as shown in FIG. 7a and FIG. 8a;

8. forming a passivation layer 6 (not shown in FIG. 7b) film on the underlay substrate 1, on which underlay substrate the pattern of the common electrode 7 is formed; forming a first via hole A in the oxide film 5 (not shown in FIG. 7b) and the passivation layer 6 film over the drain electrode 2 with an etching process, as shown in FIG. 7b and FIG. 8b;

9. forming electrically connected patterns of a pixel electrode 3 and a connecting portion 4 on the pattern of the passivation layer 6 (not shown in FIG. 7c); the connecting portion 4 is electrically connected with the drain electrode 2 through the first via hole A, as shown in FIG. 7c and FIG. 3b.

Based on the same inventive concept, an embodiment of the present invention also provides a display device, which comprises the array substrate according to the embodiment of the present invention. The display device can be any product or component with display function, such as mobile phone, tablet computer, TV, monitor, notebook computer, digital photo frame, navigator. The implementation of the display device can refer to the embodiments of the array substrate, and will not be repeated herein.

The embodiments of the invention disclose an array substrate, a manufacturing method thereof and a display device. Due to the fact that the surfaces of a source electrode, a drain electrode and a data line which are arranged on the same layer are provided with an oxide film which is formed after annealing treatment is conducted on the source electrode, the drain electrode and the data line, in the process that the pattern of a pixel electrode is formed on the source electrode, the drain electrode and the data line by the adoption of a composition technology, the oxide film can protect the source electrode and the data line under the oxide film from being corroded by an etching agent when the pattern of the pixel electrode is formed by etching, and the display quality of a display panel will not be affected; meanwhile, a connecting portion enables the drain electrode to be electrically connected with the pixel electrode through a first via hole arranged over the drain electrode and penetrating through the oxide film, therefore the normal display function of the display panel can be ensured.

Apparently, the person skilled in the art may make various alterations and variations to the invention without departing the spirit and scope of the invention. As such, provided that these modifications and variations of the invention pertain to the scope of the claims of the invention and their equivalents, the invention is intended to embrace these alterations and variations.

The invention claimed is:

1. An array substrate comprising:
   an underlay substrate;
   a source electrode, a drain electrode and a data line arranged in the same layer on the underlay substrate;
   a pixel electrode arranged in the same layer of the source electrode, the drain electrode and the data line;
   an oxide film converted from a surface portion of the source electrode, the drain electrode and the data line by partially oxidizing the source electrode, the drain electrode and the data line with an annealing treatment;
   a first via hole arranged over the drain electrode and penetrating through the oxide film;
   a connecting portion electrically connecting the drain electrode with the pixel electrode through the first via hole;
   a passivation layer extending over the drain electrode; the pixel electrode being arranged at a top of the passivation layer; and
   a common electrode arranged at a bottom of the passivation layer and opposite to the pixel electrode; and
   wherein patterns of the common electrode and the drain electrode do not overlap; the connecting portion and the pixel electrode are arranged in the same layer, and the first via hole also penetrates through the passivation layer.

2. The array substrate according to claim 1, wherein the material of the source electrode, the drain electrode and the data line is copper, the material of the oxide film is copper oxide.

3. The array substrate according to claim 1, wherein the array substrate further comprises: an active layer electrically connected with the source electrode and the drain electrode and arranged below the source electrode and the drain electrode;
   a gate electrode insulated with the active layer and arranged opposite the active layer.

4. The array substrate according to claim 1, wherein the thickness of the oxide film is 10 nm to 100 nm.

5. A display device comprising the array substrate according to claim 1.

6. The display device according to claim 5, wherein the material of the source electrode, the drain electrode and the data line is copper, the material of the oxide film is copper oxide.

7. The display device according to claim 5, wherein the array substrate further comprises: an active layer electrically connected with the source electrode and the drain electrode and arranged below the source electrode and the drain electrode;
   a gate electrode insulated with the active layer and arranged opposite the active layer.

8. The display device according to claim 5, wherein the thickness of the oxide film is 10 nm to 100 nm.

* * * * *